United States Patent [19]

Takanashi et al.

[11] 4,239,980
[45] Dec. 16, 1980

[54] INTEGRATED CIRCUIT HAVING AN OPERATION VOLTAGE SUPPLYING DEPLETION TYPE MISFET OF HIGH BREAKDOWN VOLTAGE STRUCTURE

[75] Inventors: Akira Takanashi, Kokubunji; Kenzo Masuda, Tokorozawa, both of Japan

[73] Assignee: Hitachi, Ltd., Japan

[21] Appl. No.: 931,006

[22] Filed: Aug. 4, 1978

[30] Foreign Application Priority Data

Sep. 14, 1977 [JP] Japan ................................ 52/109876

[51] Int. Cl.³ ......................................... H03K 19/094
[52] U.S. Cl. ................... 307/205; 307/251; 307/304; 307/DIG. 1
[58] Field of Search ................ 307/205, 304, DIG. 1, 307/251

[56] References Cited

U.S. PATENT DOCUMENTS

| | | | |
|---|---|---|---|
| 3,700,981 | 10/1972 | Masuitara et al. | 307/205 X |
| 4,016,430 | 4/1977 | Kanezuka | 307/205 |
| 4,039,869 | 8/1977 | Goldman et al. | 307/304 |
| 4,072,868 | 2/1978 | De La Moneda et al. | 307/304 X |
| 4,103,189 | 7/1978 | Perlegos et al. | 307/205 X |
| 4,107,548 | 8/1978 | Sakaba et al. | 307/205 |
| 4,135,102 | 1/1979 | Green et al. | 307/205 |

*Primary Examiner*—John S. Heyman
*Attorney, Agent, or Firm*—Craig and Antonelli

[57] ABSTRACT

A depletion type MISFET is connected between a power voltage supply line of a transistor logic circuit block and a power source voltage terminal. The gate electrode of the depletion type MISFET is connected to a reference voltage. The transistor logic circuit block has a driving MISFET and a load connected in series between the power voltage supply line and the reference voltage. The load of the transistor logic circuit is similarly constituted by a depletion type MISFET, while the driving MISFET is of enhancement type. The driving MISFET and the load MISFET in the transistor logic circuit block are built-in in a monolithic semiconductor integrated circuit, together with the MISFET for the power voltage supply to the transistor logic circuit. The drain of the power voltage supplying MISFET is connected to the power voltage supply terminal, and is made to have a high breakdown voltage structure so that the breakdown voltage between the drain and the substrate of the power voltage supplying MISFET may be larger than that of the load MISFET.

16 Claims, 8 Drawing Figures

INTEGRATED CIRCUIT HAVING AN OPERATION VOLTAGE SUPPLYING DEPLETION TYPE MISFET OF HIGH BREAKDOWN VOLTAGE STRUCTURE

LIST OF PRIOR ART REFERENCES (37 CFR 1.56(A))

The following references are cited to show the state of the prior art.

(1) Japanese Patent Publication No. 32450/1974, Published on Aug. 30, 1974
(2) Specification of U.S. Pat. No. 4,016,430 (Tadao Kanezuka), Apr. 5, 1977, U.S. Class 307/205
(3) Electronics, Nov. 30, 1964 pp 50–61
(4) IBM Technical Disclosure Bulletin, Vol. 16. No. 5, Oct. 1973, pp 1635–1636
(5) MOS/LSI Design and Application, Mcgraw-hill Book Company

BACKGROUND OF THE INVENTION

The present invention relates to a monolithic semiconductor integrated circuit having a transistor circuit block constituted by a driving MISFET and a load MISFET.

A MISFET circuit which can be operated by a power source voltage higher than the breakdown voltage between the drain and the source of the MISFET has been publicly known as shown in Japanese Patent Publication No. 32450/1974. This MISFET circuit includes two MISFETs. The source of one FET is connected in series to the drain of the other FET, while a reference voltage and an input signal are applied to the source and the gate of the other FET. The drain of the one FET is connected through a load resistance to a power voltage supply terminal, while the gate of the same receives a voltage higher than the threshold voltage.

Another type of MISFET circuit is disclosed in the specification of U.S. Pat. No. 4,016,430, in which the source of a depletion type MISFET is connected in series to the drain of the other MISFET, while the source and gate of the other MISFET receive a reference voltage and an input signal, respectively. The drain of the depletion type FET is connected through the load MISFET to the power source voltage terminal, while the gate of the same receives the reference voltage.

According to the study by the inventors of the present invention, it becomes clear that the prior arts explained herein before have the following disadvantages.

(1) Supposing that the load resistance in the MISFET circuit disclosed in Japanese Patent Publication No. 32450/1974 is substituted by a load MISFET and that the two FETs are formed in a monolithic semiconductor integrated circuit together with this load FET, the PN junction between the drain and the semiconductor substrate just beneath the gate insulation film of the load FET breaks down by a high voltage applied to the power source voltage terminal, depending on the condition of the voltage applied to the gate of the load FET.

(2) Turning now to the technique as shown in the specification of U.S. Pat. No. 4,016,430, the PN junction between the drain and the substrate breaks down at the semiconductor surface just below the gate insulating film of the load FET, as is the case of the above mentioned known technique, depending on the condition of the voltage applied to the gate of the load FET, when a high voltage is applied to the power voltage supply terminal of the MISFET circuit.

(3) There have been proposed some methods of improving the breakdown voltage of the PN junction between the drain and the substrate on the semiconductor surface just below the gate insulation film of the MISFET.

One of these methods is shown at pages 50 to 61 of "Electronics" published on Nov. 30, 1964, in which a MISFET of a high breakdown voltage having an offset gate construction is used. The IBM Technical Disclosure Bulletin Vol. 16, No. 5 (pp 1635–1636) published in October 1973 teaches the use of a MISFET of high breakdown voltage, in which an auxiliary semiconductor region having a impurity concentration lower than that of the source and drain regions is formed just beneath the gate electrode.

These MISFETs having improved breakdown voltage characteristics are however large in size, so that, when each of a large number of load MISFETs of a transistor logic circuit block of a monolithic semiconductor circuit is constituted by this large-sized MISFET, the density of integration of the monolithic semiconductor circuit is inconveniently lowered.

SUMMARY OF THE INVENTION

It is therefore a major object of the invention to prevent the PN junctions between the drains and the substrate at the semiconductor surfaces just beneath the gate insulation films of a large number of load MISFETs in the transistor circuit block from being broken down, without being accompanied by the lowering of the integration density of the monolithic semiconductor integrated circuit.

To this end, according to the invention, there is provided a monolithic semiconductor integrated circuit having a transistor circuit which includes a driving MISFET, a depletion type MISFET the gate of which receives a reference voltage and a load MISFET which are connected in series between the power voltage supply terminal and the reference voltage. The transistor circuit includes a large number of load MISFETs and a plurality of driving MISFETs. The sources of respective load MISFETs are connected to the reference voltage through the drain-source electric paths of driving MISFETs while the drains of respective load MISFETs are commonly connected to the source of the depletion type MISFET whose gate is connected to the reference voltage. The drain of the depletion type MISFET is connected to the power source voltage supply terminal. The depletion type MISFET has such a high breakdown voltage structure that its breakdown voltage between the drain and the substrate is larger than those of the load MISFETs.

According to a preferred form of the invention, the load MISFETs of the transistor circuit are of depletion type, while the driving MISFETs are of enhancement type.

According to another form of the invention, for the purpose of the operation of the digital logic signals of the monolithic semiconductor integrated circuit the drains of load MISFETs of all transistor logic circuits are commonly connected to the source of the above mentioned depletion type MISFET, while the drain of the driving MISFET for driving a display means, which is externally connected to the monolithic semiconductor integrated circuit, is connected to the power source voltage supply terminal or to a high voltage source.

The invention will be more fully understood from the following description of the preferred embodiment taken in conjunction with the accompanying drawings.

DESCRIPTION OF THE PREFERRED EMBODIMENTS

Figure 1:
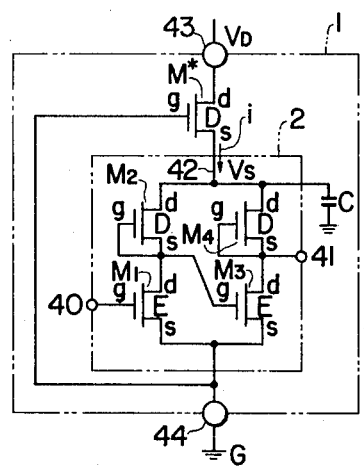
FIG. 1 is a circuit diagram of an embodiment of the invention.

Referring first to FIG. 1 showing the circuit of an embodiment of the invention, between an operation voltage supply line 42 of a transistor logic circuit block 2 formed in a monolithic semiconductor integrated circuit 1 and a power source voltage supply terminal 43 of the monolithic semiconductor circuit 1 is connected an insulated gate type field effect transistor M*(referred to as MISFET). The MISFET M* is of depletion type, and is intended for supplying the operation voltage, with its gate electrode g connected to a reference voltage terminal (grounded) 44. The drain electrode d of this operation voltage supplying MISFET M* is connected to the power source supply terminal 43, so as to receive the power source voltage $V_D$. The source voltage Vs available at the source electrode S is used as the operation voltage for the transistor logic circuit block 2.

The transistor logic circuit block 2 has a plurality of driving MISFETs M1,M3 of enhancement type, as well as a plurality of load MISFETs M2,M4 of depletion type. The source electrodes S of the driving MISFETs M1,M3 are connected to the reference voltage, while the drain electrodes d thereof are connected to the source electrodes s of the load MISFETs M2,M4. The drain electrodes d of the plurality of the load MISFETs M2,M4 are commonly connected to the source electrode s of the operation voltage supplying MISFET M*. The gate electrode g of the driving MISFET M1 is connected to the input terminal 40 of the transistor logic circuit block 2, so as to be supplied with a digital logic input signal. The gate electrode g of the driving MISFET M3 is connected to the drain electrode d of the driving MISFET M1 and to the source electrode s of the load MISFET M2. The drain electrode d of the driving MISFET M3 is connected to the output terminal 41 of the transistor logic circuit block 2, so as to derive the digital logic output signal. The gate electrodes g of the plurality of depletion type load MISFETs M2,M4 are connected to the source electrodes s, respectively. An inverter circuit constituted by an enhancement type driving MISFET and a depletion type load MISFET is reported in detail in, for example, MOS/LSI Design and Application, McGRAW-HILL BOOK COMPANY (pp 111-113).

Figure 2A:
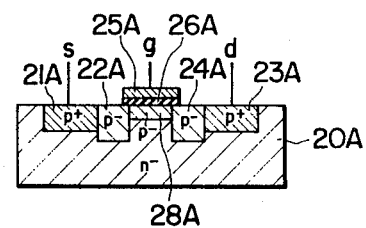
FIGS. 2A and 2B are sectional views of MISFETs having high breakdown voltage structures, as used in carrying out the invention.
Figure 2B:
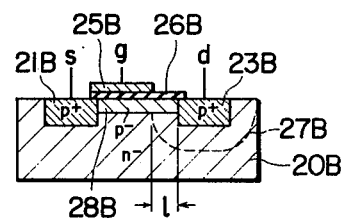

The operation voltage supplying MISFET M* of depletion type has such a high breakdown voltage structure that the breakdown voltage between its drain and the substrate is higher than those of the load MISFETs M2,M4. FIGS. 2A and 2B are sectional views of examples of the depletion type power source voltage supplying MISFET M* having the high breakdown voltage structure. In the MISFET M* as shown in FIG. 2A, auxiliary semiconductive regions 22A,24A are formed just beneath the periphery of the gate electrode 25A. These auxiliary semiconductive regions 22a,24a have a concentration of P⁻ impurities lower than the P+ type impurity concentrations in the source and drain regions 21A and 23A. Consequently, the electric field distributed through the PN junction between the N⁻ type substrate 20A and the drain region 23A in the vicinity of the grounded gate electrode 25A(g) is relaxed. In FIG. 2A, reference numeral 26A denotes a gate insulating film consisting mainly of the silicon dioxide. Beneath the gate insulating film 26A, a P⁻ channel region 28A of low impurity concentration, which is essential in forming a depletion type MISFET, is formed by, for example, an ion implantation method.

FIG. 2B is a sectional view of a depletion type MISFET having an offset gate construction. A source region 21B and a drain region 23B containing P+ type impurities are formed in the N⁻ type substrate 20B. Between the source and drain regions, formed is a P⁻ channel region 28 having low impurity concentration, by means of, for example, an ion implantation method. The gate electrode 25B(g) is formed on a gate insulating film 26B consisting mainly of silicon dioxide, and is separated from the drain region 23B leaving an offset l which is the width of a depletion layer of the PN junction between the drain region B and the N⁻ type substrate 20B, so that the electric field distributed through the PN junction between the N⁻ type substrate 20B and the drain region 23B in the vicinity of the grounded gate electrode 25B(g) is relaxed thereby to constitute a MISFET having a high drain-substrate breakdown voltage, which can be used as the MISFET M* for the operation voltage supply in the circuit of the invention.

Meanwhile, the plurality of the enhancement type driving MISFETs M1,M3 and the plurality of the depletion type load MISFETs have no high breakdown voltage structure but, rather, are constituted by conventional small-sized MISFET structures.

Figure 6:
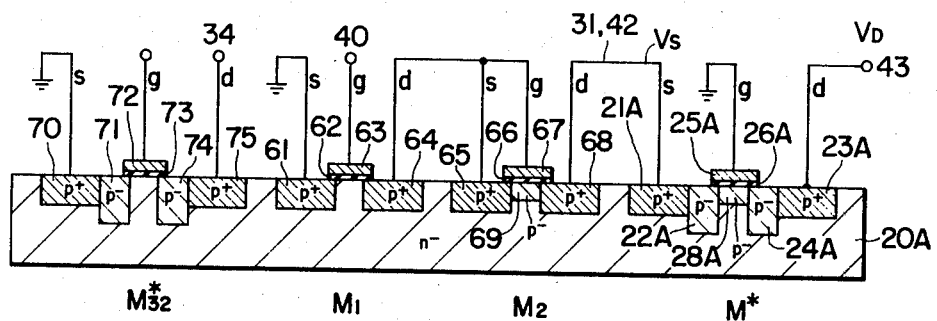
FIG. 6 is a sectional view of an essential part of the monolithick semiconductor integrated circuit as shown in FIG. 1 or FIG. 5.

FIG. 6 shows in section the construction of the MISFETs as used in the monolithic semiconductor integrated circuit of FIG. 1. The MISFET denoted by M* is the MISFET M* as shown in FIG. 1 for the operation voltage supply, and has the same high breakdown voltage structure as that of the MISFET shown in FIG. 2A. The MISFETs denoted by M1 and M2 in FIG. 6 are the enhancement type driving MISFET M1 and the depletion type load MISFET M2 of the transistor logic circuit block 2 as shown in FIG. 1, and are constituted by conventional small-sized MISFET structures. In FIG. 6, reference numerals 61 and 65 denote source regions of high P+ type impurity concentration, while reference numerals 64,68 denote drain regions of a high P+ type impurity concentration. A P− channel region 69 of low impurity concentration is formed by an ion implantation in the course of the formation of the P− channel region 28A of low impurity concentration of the operation voltage supplying depletion type MISFET M*, with different amount of ion implantation. Reference numerals 62 and 66 denote gate insulating films consisting mainly of silicon dioxide, while gate electrodes are denoted by numerals 63 and 67.

The threshold voltage VthD and the channel conductance β of the depletion type operation voltage supplying MISFET M* and the current i which flows into the transistor logic circuit block 2 are selected suitably, such that the source voltage Vs is smaller than the breakdown voltage Vb of the PN junction between the drain and the substrate in each of the load MISFETs M2,M4 of the transistor logic circuit block 2, and larger than the minimum operation voltage Vopmin of the transistor logic circuit block 2, i.e. the threshold voltage VthE of the enhancement type driving MISFET.

When the absolute value of the power source voltage VD applied to the drain d of the operation voltage supplying depletion type MISFET M*, i.e. to the power source terminal 43, is higher than the absolute value of the threshold voltage VthD of the depletion type MISFET M*, the MISFET M* operates in the region of saturation of its voltage-current characteristics, so that the relationship between the current i flowing through the drain d and the source a of the MISFET M* and further the transistor logic circuit block 2, and the source voltage of the MISFET M*, i.e. the operation voltage Vs satisfies the following equation, because the gate of the MISFET M* is grounded.

$$i = \tfrac{1}{2}\beta(VthD - |Vs|)^2 \quad (1)$$

$$\text{where } \beta = \frac{\mu e_o \times e_o}{tox} \cdot \frac{W}{L} = \beta_o \frac{W}{L}$$

$\mu$ is the carrie mobility, $\rho ox$ is the specific inductive capacity of the gate insulation film, $\rho o$ is the dielectric constant in vacuum tox is the thickness of the insulation film, $\beta o$ is the constant determined by above factors, W is the channel width and L is the channel length.

Supposing that the MISFET is of P-channel type, the following equation (2) is derived from the equation (1).

$$|Vs| = + VthD - (\frac{i}{\tfrac{1}{2}\beta_o \frac{W}{L}})^{\tfrac{1}{2}}$$

$$\therefore Vs = - VthD + (\frac{2i}{\beta_o \frac{W}{L}})^{\tfrac{1}{2}} \quad (2)$$

Thus, it is possible to make the operation voltage Vs lower than the breakdown voltage Vb of the PN junctions between the drains and the substrate of the small-sized load MISFETs M2,M4 of conventional MISFET structure, which are included in the transistor logic circuit block 2, and higher than the minimum operation volage Vopmin of the transistor logic circuit block 2, by suitably selecting the factors such as the current i through the transistor logic circuit block 2, threshold voltage VthD of the operation voltage supplying depletion type MISFET M* and the channel conductance β, especially the channel width W and the length L.

The current i is made to flow through an inverter constituted by the driving MISFET M1 and the load MISFET M2, or through another inverter constituted by the driving MISFET M3 and the load MISFET M4, in accordance with the logical level of the digital signal delivered to the input terminal 40 of the transistor logical circuit block 2. At the same time, the value of the current i when it flows through one of the inverters is substantially identical to that when the same flows through the other inverter, so that the current i flowing into the transistor logical circuit block 2 is substantially independent from the level of the digital input signal delivered to the input terminal 40, and is kept almost constant. Consequently, as will be seen from the equation (2), the operation voltage Vs available at the source s of the depletion type MISFET M* is kept substantially constant, irrespective of the power source voltage VD applied to the terminal 43, as long as the MISFET M* operates in its saturated area.

According to a preferred form of the invention, the voltage determined by the second term $$(\frac{2i}{\beta_o \frac{W}{L}})^{\tfrac{1}{2}}$$

of the equation (2) can be made sufficiently small as compared with the voltage of the first term, i.e. the threshold voltage VthD of the MISFET M*, of the same equation, by suitable selecting the current through the transistor logical circuit block 2 and the channel conductance of the operation voltage supplying MISFET M*, especially the channel width W and length L.

In this case, the operation voltage Vs is substantially determined by the threshold voltage VthD of the MISFET M*, so that the operation voltage Vs is kept substantially constant at the level of the threshold voltage VthD of the MISFET M*, even when the value of the current i flowing into the transistor logical circuit block 2 is changed slightly in accordance with the change of the logical level of the digital input signal delivered to the input terminal 40.

The operation voltage supply line 42 of the transistor logical circuit block 2 has an equivalent capacitance C which consists of the stray capacity of the wiring, PN junction capacity between the auxiliary semiconductive region 22A and the substrate 20A, as well as the source region 21A and the substrate 20A, of the operation voltage supplying MISFET M*, PN junction capacity between the drain regions 68 of the load MISFETs M2,M4 and the substrate 20A and so on.

Consequently, the high frequency component of the fluctuation of the operation voltage Vs, attributable to the fluctuation of the current i through the block 2 due to the change of the level of the digital input signal applied to the input terminal 40, is made to bypass to the reference voltage through this equivalent capacitance C, so that the fluctuation of the operation voltage Vs is suppressed.

At the same time, the output impedance at the source s of the MISFET M* is 1/gm, representing the mutual conductance of the MISFET M* by gm, which is as small as about 1kΩ. The alternating fluctuation of the operation voltage Vs can be diminished by this small output impedance.

The above described embodiment of the invention well fulfills the object of the invention, for the following reasons.

In the described embodiment, the breakdown of the PN junctions of the load MISFETs is prevented by simply connecting a operation voltage supplying depletion type MISFET M* of a relatively large size between the operation voltage supply line 42 of the transistor logical circuit block 2 and the power source voltage supply terminal 43 of the monothilic semiconductor integrated circuit 1, and by selecting the operation voltage Vs smaller than the breakdown voltage Vb of PN junctions between drains and substrate of the load MISFETs M2, M4 of the transistor logical circuit block 2. At the same time, the load MISFETs M2,M4 of the transistor logical circuit block 2 may be constituted with conventional small-sized MISFET structures, so that it becomes possible to achieve a high integration density of the monolithic semiconductor integration circuit.

Figure 3:
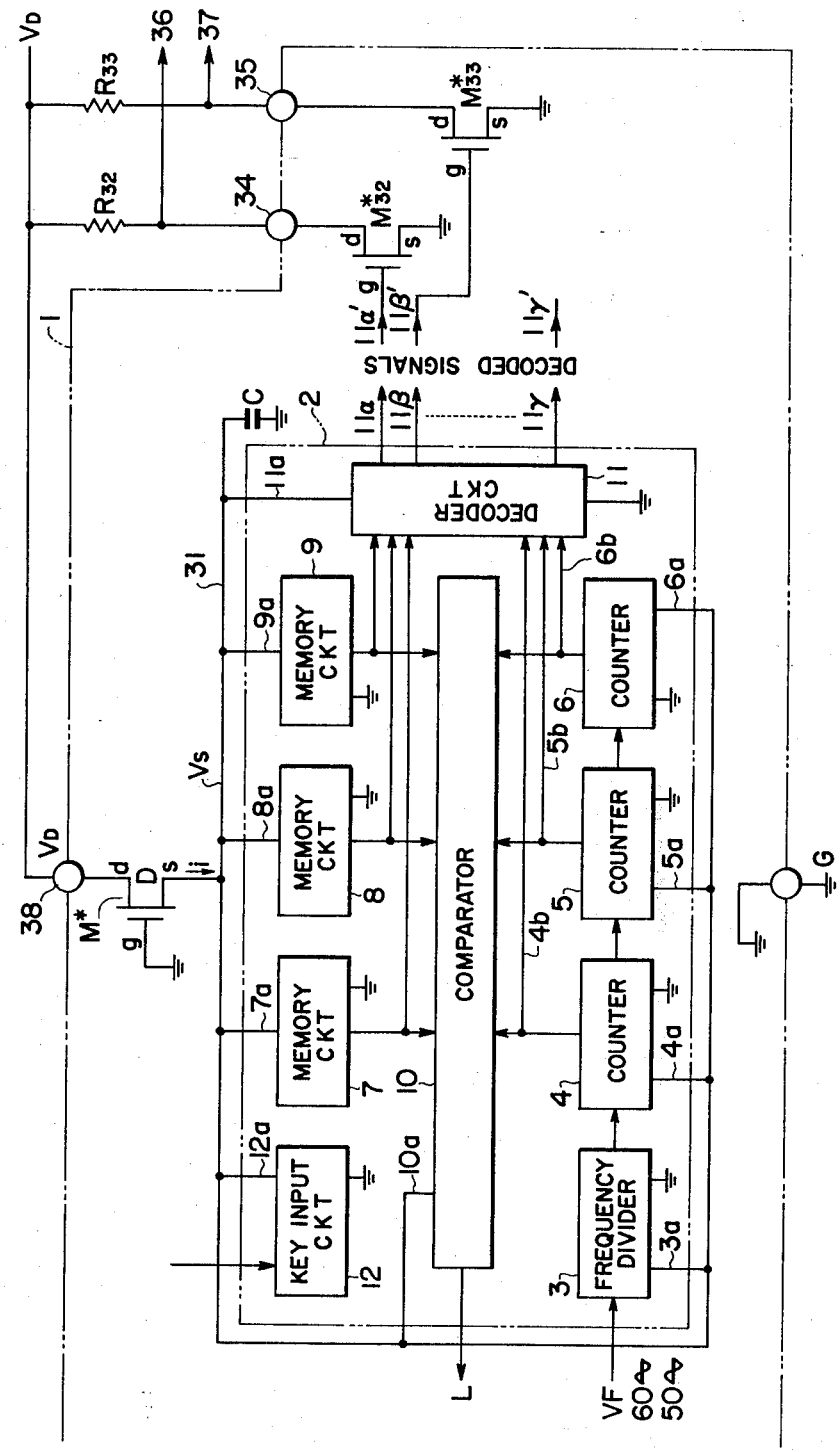
FIG. 3 is a block diagram of an essential part of a monolithick semiconductor integrated circuit in accordance with the invention.

FIG. 3 is a block diagram of an essential part of a practical monolithic semiconductor integration circuit in accordance with the invention. It will be seen that a depletion type MISFET M* for the operation voltage supply, having the high breakdown voltage structure as shown in FIG. 2, is connected between the power source voltage supply terminal 38 of the monolithic semiconductor integrated circuit 1 and the operation voltage supply terminal 31 of the transistor logical circuit block 2.

The transistor logical circuit block 2 has a frequency dividing circuit 3 adapted to form one-second pulse through dividing a reference frequency VF of 50 Hz or 60 Hz by 1/50 or 1/60, a second counter 4 adapted to produce minute pulses upon counting each 60 one-second pulse, a minute counter 5 adapted to produce an hour pulse upon counting each 60 minutes pulses, an hour counter 6 adapted to produce alternatingly morning and afternoon pulses upon counting each 12 hour pulses, memory circuits 7,8 and 9 adapted to store the digital logic signals for timer setting corresponding, respectively, to minute, hour and morning or afternoon, a comparator 10 adapted to compare the time stored in the memory circuits 7,8,9 with the time signal delivered from the second counter 4, minute counter 5 and the hour counter 6, a decoder 11 adapted to produce decode signal from the minute pulses from the second counter 4, hour pulses from the minute counter 5 and the morning or afternoon pulse from the hour counter 6, or from the minute, hour and morning or afternoon digital signals from the memory circuits 7,8,9, the decode signal being for use in driving a display means constituted by nixy tube, degitron or light emitting diode(LED), and a key-input circuit 12 for the correction of the minute, hour and morning or afternoon informations in the second counter 4, minute counter 5 and hour counter 6, and for setting the desired time in the memory circuits 7,8,9.

The power source lines 3a,4a,5a,6a,7a,8a,9a,10a,11a and 12a of the frequency dividing circuit 3, counters 4,5,6, memory circuits 7,8,9, comparator 10, decoder circuit 11 and of the key-inputting circuit 12 are commonly connected to the operation voltage supply line 31, and to the source s of the operation voltage supplying depletion type MISFET M* having the high breakdown voltage structure as shown in FIG. 2. The decode signals such as $11\alpha, 11\beta \ldots 11\gamma$ from the decoder circuit 11 are amplified as required by a buffer amplifier circuit. The amplified signals $11'\alpha, 11'\beta \ldots 11'\gamma$ are applied to the gates of the enhancement type MISFETs M32*, M33* for driving the display means constituted by a nixy tube, degitron or LED. These driving MISFETs M32*, M33* of enhancement type have high breakdown voltage structures, in each of which, as shown, for example, in FIG. 6, auxiliary semiconductive regions 71, 74 of P− type impurity concentration lower than the P+ type impurity concentration in the source and the drain regions 70, 75 are formed beneath the periphery of the gate electrode 72, so as to relax the electric field distributed in the PN junction between the N− type substrate 20A and the drain region 75 in the vicinity of the gate electrode 72(g).

The drains d of the display driving enhancement type MISFETs M32*, M33* having the high breakdown voltage structures are connected to respective display output terminals 34, 35 of the monolithic semiconductor integrated circuit 1, and to the source voltage Vd through external load resistances R32 and R33.

Figure 5:
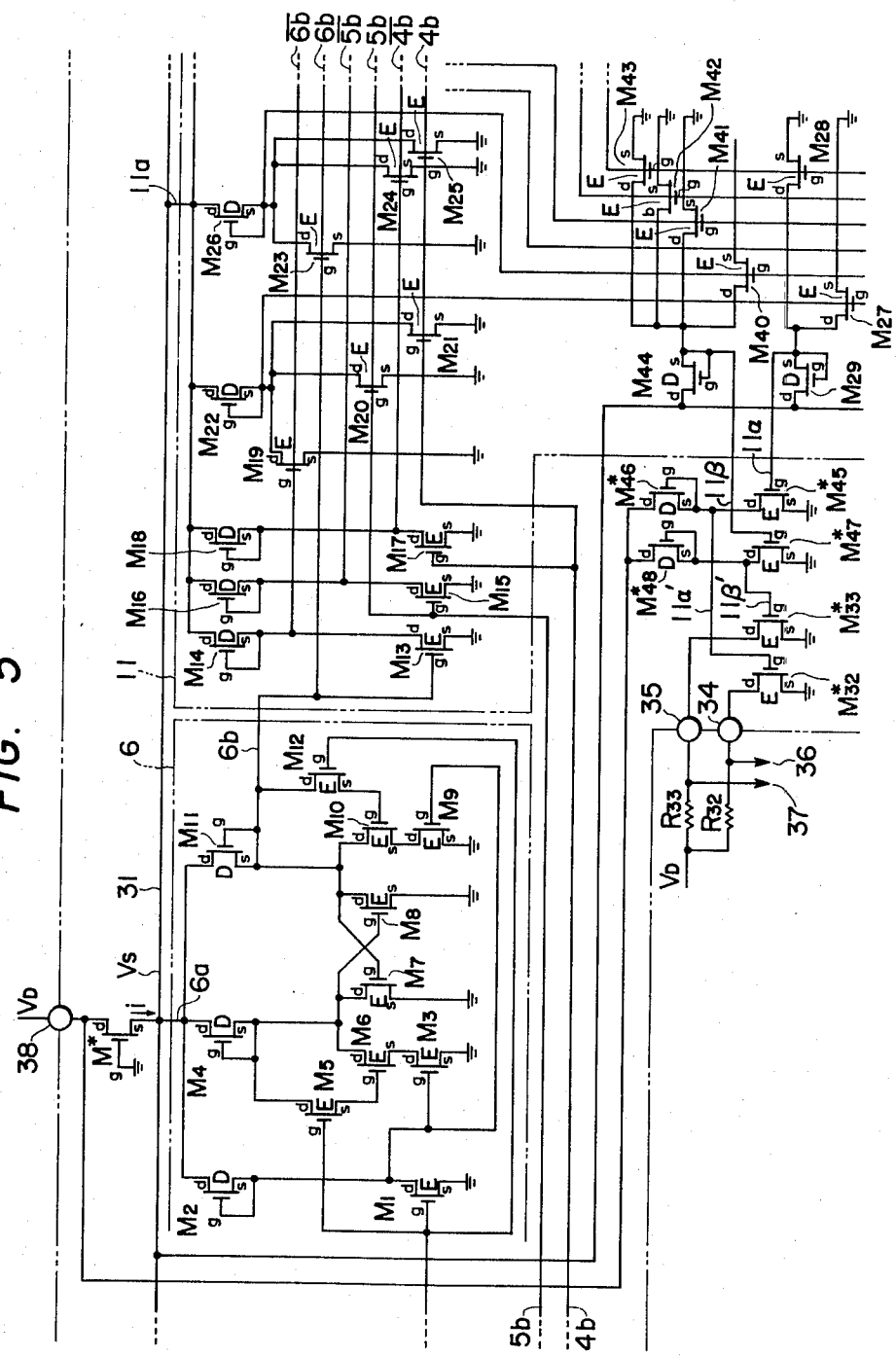
FIG. 5 shows a circuit which is partially equivalent to the essential circuit part as shown in FIG. 3.

FIG. 5 shows a circuit partially equivalent to the essential circuit part of the monolithic circuit block diagram as shown in FIG. 3. The hour counter 6 includes a frequency dividing circuit including enhancement type MISFETs M1,M3,M5,M6,M7,M8,M9,M10 and M12 and depletion type load MISFETs M2,M4 and M11. The decoder circuit 11 includes depletion type load MISFETs M14,M16 and M18, and driving enhancement type MISFETs M13,M15,M17 which constitute a plurality of inverters for producing inverted signal $\overline{4b},\overline{5b},\overline{6b}$ from the output $4b,5b,6b$ which are delivered from the counters 4,5,6, respectively.

The decoder circuit 11 further includes enhancement type driving MISFETs. M19, M20, M21, M23, M24, M25, M27, M28, M40, M41, M42, and M43, which constitute a read only memory (ROM) circuit for obtaining decode signals $11\alpha,11\beta \ldots$ from the outputs $4b,5b,6b$ from the counters 4,5,6 and from the inverted signals $\overline{4b},\overline{5b},\overline{6b}$, as well as depletion type load MISFETs M22,M26,M29 and M44. The decode signals from the decoder circuit 11 are amplified by means of a buffer amplifier circuit which is constituted by enhancement type driving MISFETs M45*,M47* having high breakdown voltage structures and by depletion type load MISFETs M46*,M48* also having the high breakdown voltage structures.

The enhancement type driving MISFETs M45*,M47* having the high breakdown voltage structures can have constructions similar to that of the high breakdown voltage enhmcement type MISFET M32* as shown in FIG. 6, while the high breakdown voltage depletion type load MISFETs M46*,M48* can have the similar structure to that of the high breakdown voltage depletion type MISFET M* as shown in FIG. 6.

The amplified encode signals $11\alpha',11\beta' \ldots$ are applied to the gates g of the enhancement type display driving MISFETs M32*,M33* having the high breakdown voltage structures, as will be seen from FIG. 5. The enhancement type driving MISFET and the depletion type load MISFET included by the counter 6 and the decoder circuit of FIG. 5 have similar structure to those of the enhancement type MISFET M1 and the depletion type MISFET M2, which are of conventional small-sized MISFET structures, as shown in FIG. 6.

The drains d of the depletion type load MISFETs M2,M4,M11 in the counter 6 are commonly connected to the power source line 6a, while the drains d of the depletion type load MISFETs M14,M16,M18,M22,M26,M29 and M44 are commonly connected to the power source line 11a.

The device parameters such as construction dimension and so forth of the depletion type MISFET M* for the operation voltage supply of the monolithic semiconductor integrated circuit in accordance with the invention are determined by the following procedure.

(A) The operation voltage Vs available at the source s of the depletion type operation voltage supplying MISFET M* is obtained from the foregoing equation (2). Meanwhile, the breakdown voltage Vd of the PN junctions between the substrate and the drains of the depletion type load MISFETs M2,M4,M11,M14,M16,M18,M22,M26,M29,M44, which have the conventional small-sized MISFET structure, is about −18 V. In order to maintain the operation voltage Vs available at the source s of the MISFET M* lower than the above stated breakdown voltage Vb, irrespective of the value of the current i through the source s of the MISFET M* and flowing into the power source lines 3a,4a,5a,6a,7a,8a,9a,10a,11a,12a of the transistor logical circuit block 2, the threshold voltage VthD of this MISFET M* is selected to be smaller than the above mentioned breakdown voltage Vb.

The minimum operation voltage Vopmin of the transistor logical circuit block 2 is given by the operation voltage Vs which is smallest but necessary for the circuits in the block 2 to perform their digital switching operations. Consequently, the value of the threshold voltage VthE of the enhancement type MISFET M1,M3,M5,M6,M7 for driving becomes substantially equal to the aforementioned minimum operation voltage Vopmin. For this reason, the value of the threshold voltage VthD of the operation voltage supplying depletion type MISFET M* is made higher than the threshold voltage VthE of the enhancement type driving MISFET and the aforementioned minimum operation voltage Vopmin.

Since the breakdown voltage of the PN junction between the substrate and the drains of the depletion type load MISFET of conventional small-sized MISFET structure is about, as stated before, −18 V, while the threshold voltage VthE of the enhancement type driving MISFET is about −4 V and the minimum operation voltage Vopmin is about −4.5 V, the threshold voltage VthD of the operation voltage supplying depletion type MISFET M* is selected to be about +14 V.

The threshold voltages of the depletion type load MISFETs M2,M4,M11,M14,M16 . . . are set at about 3 V, independently of the above.

(B) The operation voltage Vs available at the source s of the operation voltage supplying depletion type MISFET M* is given by the foregoing equation (2) when the MISFET M* operates in the saturated area. When this MISFET M* operates in the linear range (triode region), the relationship between the operation voltage Vs at the source s of this MISFET M*, the power source voltage VD at the drain d and the current i through the source s is given by the following equation.

$$i = \beta_o \frac{W}{L} \{(|V_{thD}| - |Vs|)(|Vd| - |Vs|) - \frac{1}{2}(|Vd| - |Vs|)^2\} \quad (3)$$

The equation (3) can be transformed into the following equation (4).

$$\frac{2i}{\beta_o \frac{W}{L}} = (|Vd| - |Vs|)\{2|V_{thD}| - |Vs| - |Vd|\} \quad (4)$$

From the above equations, it will be seen that the operation voltage Vs available at the source s of the operation voltage supplying depletion type MISFET M* depends on the current i through the source s, the constant $\beta_o$ peculiar to the MISFET M* and the channel width and length W,L, irrespective of whether the MISFET M* is operating in the saturated region or in the linear region.

Figure 7:
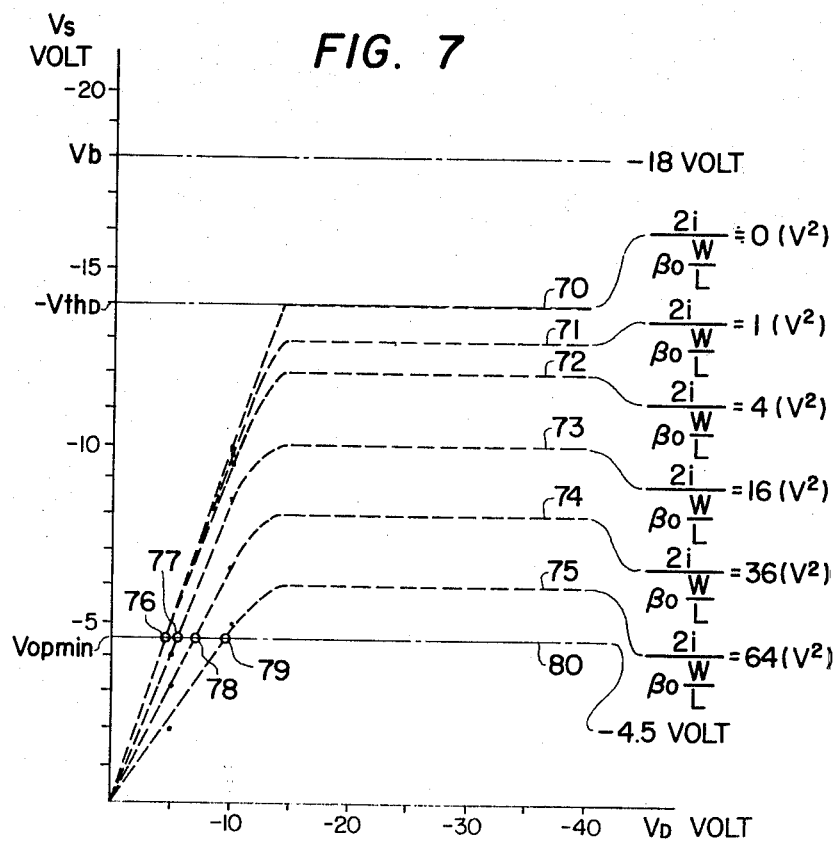
FIG. 7 shows the relationship between the source voltage VD and operation voltage Vs, with a parameter of $$\left( \frac{2i}{\beta_o \frac{W}{L}} \right).$$

FIG. 7 shows the relationship between the operation voltage Vs and a parameter which is determined by the factors of the current i, constant $\beta_o$, channel width W and length L, on the assumption of the condition as set forth in the foregoing item A, i.e. on the assumption that the operation voltage supplying depletion type MISFET M* has a threshold voltage of +14 V.

The operation voltage Vs is almost constant, irrespective of the power source voltage VD, when the latter VD takes a negative value larger than the threshold voltage VthD of the MISFET M*, so that the latter is operated in the saturated region. To the contrary, the operation voltage Vs depends on the power source voltage VD, so that the MISFET M* functions in the linear region, when the power source voltage VD takes a negative value smaller than that of the threshold voltage VthD of the MISFET M*.

As will be seen from the relationship between the power source voltage VD and the operation voltage Vs, shown in FIG. 7 with the parameter of $$\left(\frac{2i}{\beta_o \frac{W}{L}}\right),$$

the operation voltage Vs when the MISFET M* operates in the saturated region comes closer to the power source voltage VD, as the value of the parameter $$\left(\frac{2i}{\beta_o \frac{W}{L}}\right)$$

gets smaller.

In FIG. 7, the characteristic curves 70,71,72 are drawn for the values of the parameters $$\left(\frac{2i}{\beta_o \frac{W}{L}}\right)$$

of 0,1 and 4($V^2$), respectively. These curves intersect a line 80 which represents the minimum operation voltage Vopmin of −4.5 V at points 76, while characteristic curves 73,74,75, which have been drawn for the values of the parameter $$\left(\frac{2i}{\beta_o \frac{W}{L}}\right)$$

of 16,36 and 64($V^2$) intersect the line 80 at point 77,78 and 79, respectively.

From the condition of the intersection of the characteristic curves 70,71,72,73,74,75 and the line 80 representing the minimum operation voltage Vopmin of −4.5 V, it is understood that the value of the parameter $$\left(\frac{2i}{\beta_o \frac{W}{L}}\right)$$

is preferably small, in order that the operation voltage Vs does not easily come down below the minimum operation voltage Vopmin due to the lowering of the power source voltage VD.

The construction and dimension of the operation voltage supplying depletion type MISFET M* of the monolithic semiconductor integrated circuit of the embodiment as shown in FIG. 3 are determined as follows. It has been estimated that the value of the current, which flows into the power source lines 3a–12a of the circuits of the transistor logical circuit block, after passing through the source s of the MISFET M* and then through the operation voltage supplying terminal 31 of the block 2, is to be 2.5 mA. At the same time, the constant $\beta_o$ of the MISFET M* and the ratio of the channel width to the channel length W/L have been selected to be $5 \times 10^{-6}$ (V)(Ω) and 1000, respectively, so that the parameter $$\left(\frac{2i}{\beta_o \frac{W}{L}}\right)$$

may become 1(V²).

Figure 4:
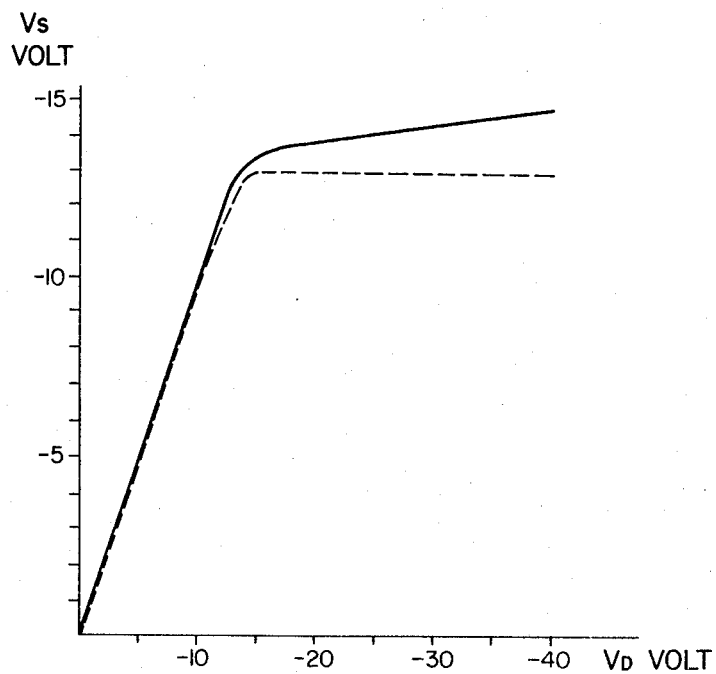
FIG. 4 shows a characteristic of the circuit as shown in FIG. 3.

FIG. 4 shows a power source voltage $V_D$-operation voltage Vs characteristic obtained when the depletion type operation voltage supplying MISFET M* having above specified numerical properties is used in the monolithic semiconductor integrated circuit as shown in FIG. 3. The theoretical values and the actually measured values are shown, respectively, by broken line and full line curves. The actually measured value exceeding the level of the theoretical value is attributable to the fact that the current i is smaller than the estimated one, while the fact that the actually measured operation voltage Vs slightly increases in accordance with the power source voltage Vo is attributable to the channel length modulation of the MISFET M*.

The above described preferred embodiments of the invention not only fulfill the aforementioned objects of the invention but also offer the following additional advantages.

(1) When the operation voltage supplying depletion type MISFET M* functions in the saturated region, the operation voltage available at the source s of the MISFET M* is kept constant, as will be seen from the equation (2), even when the power source voltage applied to the drain d of the MISFET M* is varied. Consequently, the power consumption in the transistor circuit block 2 connected to the source s can be maintained at a desired constant level.

(2) The value of the operation voltage Vs available at the source of the MISFET M* can be made substantially equal to the value of the power source voltage VD applied to the drain of the MISFET M*, by suitably selecting the values of the current i through the source of the MISFET M*, constant $\beta_o$ peculiar to the MISFET M* and the channel width W and length L, such that the value of the parameter $$\left(\frac{2i}{\beta_o \frac{W}{L}}\right)$$

becomes small. Consequently, a wider range of the source voltage can be used.

(3) When the load MISFETs M2,M4,M11,M14,M16 ... in the transistor logical circuit block 2 are constituted by depletion type MOSFETs, the P⁻ channel regions 69 of low impurity concentration of these MOSFETs can be formed by the process substantially same as that for forming the P⁻ channel regions 28A,28B of low impurity concentration of the power voltage supplying depletion type MOSFET M*, through, for example, ion implantation technique.

For making the threshold voltage VthD of the operation voltage supplying MISFET M* different from that of the load MISFET, such that the latter is +14 V while the former is +3 V, the amount of P type impurities implanted into the P⁻ channel regions 28A,28B of the MISFET M* is made larger than that implanted to the load MISFETs.

As has been described, according to the invention, the aforesaid object of the invention can be achieved by constituting the operation voltage supplying MISFET M* by a MISFET having a high breakdown voltage structure. In addition, the invention can be suitably applied to a monolithic semiconductor circuit making use of the so-called LOCOS (Local Oxidization Semiconductor) which is effective for obtaining a high density of integration, because the density of the integration will be further increased.

What is claimed is:

1. A monolithic semiconductor integrated circuit having a transistor circuit which includes a depletion type MISFET to the gate of which is applied a reference voltage,
   characterized in that said transistor circuit includes a plurality of load MISFETs and a plurality of driving MISFETs, said depletion type MISFET being connected in series with at least one of said load MISFETs and at least one of said driving MISFETs between a power source voltage terminal and the reference voltage, the sources of said load MISFETs being connected to said reference voltage through the drain-source electric paths of said driving MISFET, the drains of said load MISFETs being connected commonly to the source of said depletion type MISFET, said depletion type MISFET having its drain connected to said power source voltage terminal, wherein said depletion type MISFET has a high breakdown voltage structure such that the breakdown voltage between its drain and the substrate is higher than the breakdown voltage across the junction between said substrate and the drains of said plurality of load MISFETs.

2. A monolithic semiconductor integrated circuit as claimed in claim 1, wherein said transistor circuit is adapted to perform digital switching operations, and wherein the current i through said depletion type MISFET connected at its gate to said reference voltage, and threshold voltage VthD, the constant $\beta_o$, and the channel width W and length L of said depletion type MISFET connected at the gate to said reference voltage are so selected that the operation voltage available at the source of said depletion type MISFET connected at the gate to said reference voltage, when said depletion type MISFET is operated at the saturated region is smaller than the breakdown voltage across the junction between said substrate and the drains of said plurality of load MISFETs, and larger than the minimum operation voltage required for the digital switching operations of said transistor circuit.

3. A monolithic semiconductor integrated circuit as claimed in claim 2, wherein the parameter $$\left( \frac{2i}{\beta_o \frac{W}{L}} \right)$$

defined by the current i through the source of said depletion type MISFET connected to the gate to said reference voltage, constant $\beta_o$, channel width W and length L of said MISFET is selected to be small, such that the operation voltage available at the source of said MISFET becomes substantially equal to the power source voltage when said MISFET functions in the linear region.

4. A monolithic semiconductor integrated circuit as claimed in claim 3, wherein the value of said parameter is selected to be $16(V^2)$ or smaller.

5. A monolithic semiconductor integrated circuit as claimed in claim 3, wherein the value of said parameter is selected to be $4(V^2)$ or smaller.

6. A monolithic semiconductor integrated circuit as claimed in claim 1, 2, 3, 4, or 5, wherein said plurality of load MISFETs are of depletion type, while said plurality of driving MISFETs are of enhancement type.

7. A monolithic semiconductor integrated circuit as claimed in claim 2, 3, 4, or 5, characterized by further comprising an output driving MISFET for driving a display means connected externally to said monolithic semiconductor integration circuit, said output driving MISFET having a high breakdown voltage structure, the drain of said output driving MISFET being connected to said power source voltage supply terminal or to any other high voltage source, through a load resistance connected externally to said monolithic semiconductor integrated circuit.

8. A monolithic semiconductor integrated circuit as claimed in claim 1, 2, 3, 4, or 5, wherein auxiliary semiconductive regions of low impurity concentration are formed beneath the periphery of the gate electrode of said depletion type MISFET connected at the gate to said reference voltage.

9. A monolithic semiconductor integrated circuit as claimed in claim 1, 2, 3, 4, or 5, wherein said depletion type MISFET connected at its gate to said reference voltage is of offset gate type.

10. A monolithic semiconductor integrated circuit as claimed in claim 1, wherein the sources and drains of the driving MISFETs, the depletion type MISFET and the load MISFETs are formed in a substrate of the monolithic semiconductor integrated circuit.

11. A monolithic semiconductor integrated circuit as claimed in claim 2, wherein $$\beta_o = \frac{\mu \, e_{ox} e_o}{tox}$$

where
$\mu$ is the carrier mobility,
$e_{ox}$ is the specific inductive capacity of the gate insulation film,
tox is the thickness of the gate insulation film of the depletion type MISFET, and
$e_o$ is the dielectric constant in vacuum.

12. A monolithic semiconductor integrated circuit as claimed in claim 6, characterized by further comprising an output driving MISFET for driving a display means connected externally to said monolithic semiconductor integration circuit, said output driving MISFET having a high breakdown voltage structure, the drain of said output driving MISFET being connected to said power source voltage supply terminal or to any other high voltage source, through a load resistance connected externally to said monolithic semiconductor integrated circuit.

13. A monolithic semiconductor integrated circuit as claimed in claim 6, wherein auxiliary semiconductive regions of low impurity concentration are formed beneath the periphery of the gate electrode of said depletion type MISFET connected at the gate to said reference voltage.

14. A monolithic semiconductor integrated circuit as claimed in claim 7, wherein auxiliary semiconductive regions of low impurity concentration are formed beneath the periphery of the gate electrode of said depletion type MISFET connected at the gate to said reference voltage.

15. A monolithic semiconductor integrated circuit as claimed in claim 6, wherein said depletion type MISFET connected at its gate to said reference voltage is of offset gate type.

16. A monolithic semiconductor integrated circuit as claimed in claim 7, wherein said depletion type MISFET connected at its gate to said reference voltage is of offset gate type.

* * * * *